(12) United States Patent
Liu

(10) Patent No.: US 11,679,680 B2
(45) Date of Patent: Jun. 20, 2023

(54) POWER MODULE FOR OPERATING AN ELECTRIC VEHICLE DRIVE WITH AN INTERMEDIATE CIRCUIT CAPACITOR

(71) Applicant: ZF Friedrichshafen AG, Friedrichshafen (DE)

(72) Inventor: Wei Liu, Friedrichshafen (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 0 days.

(21) Appl. No.: 17/495,974

(22) Filed: Oct. 7, 2021

(65) Prior Publication Data

US 2022/0111733 A1 Apr. 14, 2022

(30) Foreign Application Priority Data

Oct. 8, 2020 (DE) ...................... 10 2020 212 748.4

(51) Int. Cl.
*H03K 17/56* (2006.01)
*B60L 3/04* (2006.01)
*B60L 53/20* (2019.01)

(52) U.S. Cl.
CPC ................. *B60L 3/04* (2013.01); *B60L 53/20* (2019.02); *H03K 17/56* (2013.01)

(58) Field of Classification Search
CPC ............ B60L 3/04; B60L 53/20; H03K 17/56
See application file for complete search history.

(56) References Cited

U.S. PATENT DOCUMENTS 9,106,124 B2   8/2015 Bayerer et al.
10,263,506 B2 *  4/2019 Brueckner ....... H03K 17/08104
2016/0093589 A1 *  3/2016 Sato .................. H01L 23/049
                                                       257/690

FOREIGN PATENT DOCUMENTS

DE         3937045 A1   5/1991
DE    102010006850 A1   8/2011
DE    102010002627 A1   9/2011
WO    WO 2011/095309 A2   8/2011

OTHER PUBLICATIONS

German Search Report DE 10 2020 212 748.4, dated Jun. 14, 2021. (14 pages).

* cited by examiner

*Primary Examiner* — Metasebia T Retebo
(74) *Attorney, Agent, or Firm* — Dority & Manning, P.A.

(57) ABSTRACT

A power module (10) for operating an electric vehicle drive includes a current input configured for supplying an input current. The current input includes multiple contact elements (182, 184). Multiple circuit-breakers (142, 144) are configured for generating an output current based on the supplied input current. A current output (192) is configured for outputting the output current at a consumer. A substrate (12) includes a metal layer (122-130) and an insulating layer (121) connected to the metal layer (122-130). The multiple circuit-breakers (142, 144) are arranged on the metal layer (122-130). The multiple contact elements (182, 184) are also arranged on the metal layer (122-130) such that the multiple contact elements (182, 184) extend perpendicular to a surface of the substrate (12).

9 Claims, 1 Drawing Sheet

POWER MODULE FOR OPERATING AN ELECTRIC VEHICLE DRIVE WITH AN INTERMEDIATE CIRCUIT CAPACITOR

CROSS-REFERENCE TO RELATED APPLICATION

The present application is related and has right of priority to German Patent Application No. 102020212748.4 filed in the German Patent Office on Oct. 8, 2020, which is incorporated by reference in its entirety for all purposes.

FIELD OF THE INVENTION

The present invention relates generally to the field of electromobility, in particular of the power modules for operating an electric drive for a vehicle.

BACKGROUND

Power modules, in particular integrated power modules, are being used to an increasing extent in motor vehicles. These types of power modules are used, for example, in DC/AC inverters, which are utilized for energizing electric machines, such as electric motors, with a multiphase alternating current. In the process, a direct current generated by a DC energy source, for example, a battery, is converted into a multiphase alternating current. The power modules are based on power semiconductors, in particular transistors such as IGBTs, MOSFETs, and HEMTs. Further fields of use are DC/DC converters and AC/DC rectifiers (converters) and transformers.

The power semiconductors are generally used for forming circuit-breakers, which are utilized in a bridge circuit. A frequent example is the half-bridge, which includes a high-side component and a low-side component. The high-side and low-side components each include one or multiple circuit-breaker(s), namely high-side circuit-breakers and low-side circuit-breakers. By switching the high-side and low-side circuit-breakers in a targeted manner, the direction of the current generated at the output of the power module (output current) can be changed, with a very short cycle, between a positive current direction and a negative current direction. This allows for a pulse width modulation, in order to generate, in the case of a DC/AC inverter, an alternating current based on a direct current supplied on the input side of the power module.

In all these applications, it is advantageous that the switching time of the utilized circuit-breakers is sufficiently short. Due to the advances made in the field of power semiconductors, short switching times can be implemented with wide-bandgap semiconductors, such as SiC and GaN.

Nevertheless, the power modules known from the prior art have the disadvantage that the short switching times of the utilized semiconductor materials induce high voltages in these power modules in the presence of leakage inductance prevailing in the power lines of the power module during the switching on and off of the circuit-breakers. High voltages can cause the circuit-breakers and/or the power semiconductors contained therein to blow and, thereby, become adversely affected.

SUMMARY OF THE INVENTION

Example aspects of the invention therefore better protect the power semiconductors against blowing due to voltage peaks during the switching on and off, in order to increase the performance of the power module.

Example aspects of the present invention provide a method for manufacturing a power module and also provide a power module and use of the power module in a vehicle.

The power module within the scope of example aspects of the invention is utilized for operating an electric drive of a vehicle, in particular of an electric vehicle and/or a hybrid vehicle. The power module is preferably utilized in a DC/AC inverter. In particular, the power module is utilized for energizing an electric machine, for example, an electric motor and/or a generator. A DC/AC inverter is utilized for generating a multiphase alternating current from a direct current generated by a DC voltage of an energy source, for example, a battery.

In order to supply an input current (direct current), the power module has a current input or input contact. The current input generally includes multiple contact elements. One portion, in particular a first half, of the contact elements is associated with a positive pole of the current input, wherein another portion, in particular a second half, of the contact elements is associated with a negative pole of the current input. During operation of the power module, the positive pole is electrically conductively connected to a positive terminal of the battery, wherein the negative pole is electrically conductively connected to a negative terminal of the battery.

The power module further includes a plurality of circuit-breakers. These semiconductor-based circuit-breakers are utilized for generating an output current, based on the supplied input current, by actuating the individual circuit-breakers. The actuation of the circuit-breakers can be based on a pulse width modulation. In the case of an inverter, the input current is a direct current, wherein the output current is an alternating current.

The multiple circuit-breakers preferably form a bridge circuit arrangement, which can include one or multiple bridge circuit(s) (for example, a half-bridge or half-bridges). Each bridge circuit or half-bridge includes one high-side switch (HS switch) or multiple high-side switches connected to one another in parallel and one low-side switch (LS switch) or multiple low-side switches connected to one another in parallel. The HS switch(es) is/are connected in series to the LS switch(es). In the case of an inverter, each half-bridge is associated with a current phase of the multiphase alternating current (output current). The HS switches and LS switches each include one or multiple power semiconductor component(s) such as IGBT, MOSFET, or HEMT. The semiconductor material forming the basis of the particular power semiconductor component preferably includes a wide-bandgap semiconductor, such as silicon carbide (SiC) or gallium nitride (GaN). Alternatively or additionally, the wide-bandgap semiconductor can contain silicon.

For the purpose of voltage-smoothing, the power module can further include an intermediate circuit capacitor, which is connected in parallel to the circuit-breakers.

The power module also includes a substrate or an insulating substrate for the mounting of the circuit-breakers. The insulating substrate includes a first metal layer, a second metal layer, and an insulating layer arranged between the first metal layer and the second metal layer. The insulating layer is preferably a direct bonded copper (DCB) insulating substrate. The circuit-breakers are mounted on the first metal layer. For example, the circuit-breakers are secured on the first metal layer by sintering, welding, soldering, or by a screw connection. The multiple contact elements of the current input are also arranged on the first metal layer, in such a way that the contact elements extend perpendicular to a surface of the first metal layer.

The power module preferably further includes a heat sink, which is configured for dissipating heat that is produced in the power module, in particular in the circuit-breakers, at high input currents. Preferably, the heat sink can be mounted at the second metal layer of the substrate.

According to example aspects of the invention, due to the fact that the contact elements of the current input, in addition to the circuit-breakers, are also arranged on the first metal layer of the substrate, and so the contact elements extend perpendicular to the surface of the first metal layer, a power module is created, in which the lengths of the electrical lines between the contact elements and the circuit-breakers are shorter. Associated therewith, the leakage inductance of the electrical lines in the power module is reduced. This reduces the probability and the magnitude of the voltage peaks, which are caused during the switching on and off of the circuit-breakers due to the leakage inductance and can cause the circuit-breakers to blow. The functionality of the power module is improved as a result. In particular, when WBG semiconductor materials are used, it is possible to utilize the short switching times of this material group, without the circuit-breakers being subjected to the risk of blowing as is the case with the power modules known from the prior art.

BRIEF DESCRIPTION OF THE DRAWINGS

Embodiments are now described by way of example and with reference to the attached drawings, wherein.

In the figures, identical reference characters refer to identical or functionally identical referenced parts. The particular relevant referenced parts are labeled in the individual figures.

DETAILED DESCRIPTION

Figure 1:
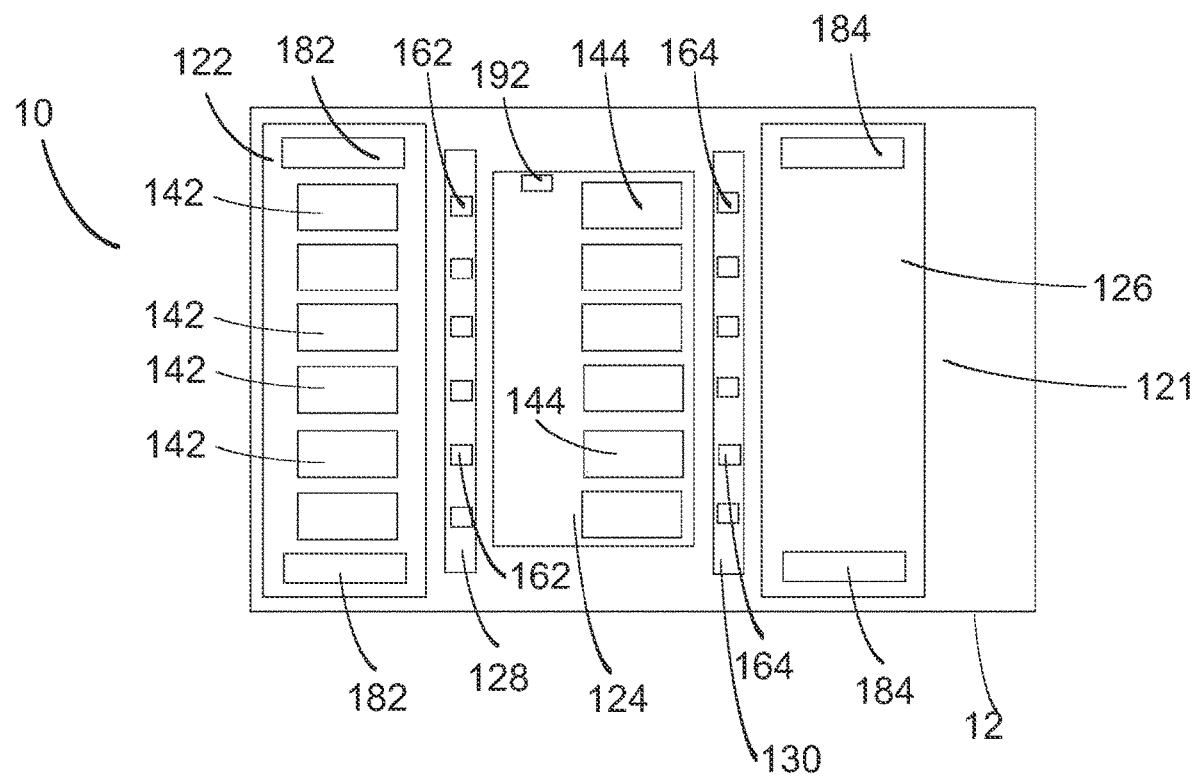
FIG. 1 shows a schematic of a power module according to one example embodiment.

Reference will now be made to embodiments of the invention, one or more examples of which are shown in the drawings. Each embodiment is provided by way of explanation of the invention, and not as a limitation of the invention. For example, features illustrated or described as part of one embodiment can be combined with another embodiment to yield still another embodiment. It is intended that the present invention include these and other modifications and variations to the embodiments described herein.

FIG. 1 shows a schematic of a power module 10 according to one example embodiment. The power module 10 includes a plurality of circuit-breakers 142, 144, which are arranged on a metal layer 122, 124, respectively. The metal layer 122, 124 is part of a substrate 12, which additionally includes an insulating layer 121, on which the metal layer 122, 124, 126 is arranged. The metal layer has a first zone 122, in which a first circuit-breaker group of the circuit-breakers 142 is arranged. The metal layer has a second zone 124, in which a second circuit-breaker group of the circuit-breakers 144 is arranged. The metal layer has a third zone 126. A fourth zone 128 of the metal layer is arranged between the first zone 122 and the second zone 124. Multiple first impedances 162, which preferably include electrical resistors, are arranged in the fourth zone 128. A fifth zone 130 of the metal layer is arranged between the second zone 124 and the third zone 126. Multiple second impedances 164, which preferably include electrical resistors, are arranged in the fifth zone 130. The zones 122-130 of the metal layer are spatially separated from one another, in order to allow for electrical insulation.

The substrate 12 can include a direct bonded copper (DCB) insulating substrate and, in addition to the (first) metal layer 122-130 and the insulating layer 121, can also include a second metal layer (not shown), which is arranged at a side of the insulating layer 121 opposite the first metal layer 122-130. The second metal layer can be connected to a heat sink, for example, made of aluminum, in order to allow for a heat dissipation from the circuit-breakers 142, 144 and from further heat-generating components (for example, an intermediate circuit capacitor) of the power module 10.

In addition to the first circuit-breaker group, two contact elements 182 of a current input of the power module 10 are also arranged in the first zone 122 of the metal layer. Preferably, the contact elements 182 are a positive pole of a DC current input. Moreover, two contact elements 184 of the current input of the power module 10 are arranged in the third zone 126 of the metal layer. Preferably, the contact elements 184 are a negative pole of the DC current input. In addition to the second circuit-breaker group, a current output 192, preferably an AC current output, is arranged in the second zone 124.

Preferably, the circuit-breakers 142 of the first circuit-breaker group are high-side switches, wherein the circuit-breakers 144 of the second circuit-breaker group are preferably low-side switches. In FIG. 1, six high-side switches 142 and six low-side switches 144 are shown, which, together, form a half-bridge, which is associated with a current phase of the multiphase alternating current in the case of an inverter.

In the power module 10 in FIG. 1, only one half-bridge is shown, by way of example. This is not limiting for the present invention. Generally speaking, the components shown in FIG. 1 can form a sub-module of the power module 10, wherein the power module 10 can include three or a further number of such sub-modules, wherein each sub-module is associated with a current phase of the multiphase inverter.

The connection between the metal layer and the circuit-breakers 142, 144, the contact elements 182, 184, the impedances or electrical resistors 162, 164, as well as the current output 192 is an electrical connection, in order to allow for a power and/or signal line.

According to example aspects of the invention, the contact elements 182, 184 extend essentially perpendicular to a surface of the substrate 12 (pointing out of the plane of the drawing in FIG. 1). In this way, the length of the electrical line between the positive electrode of the power supply, for example, a battery, and the power module 10 can be reduced on the current input-side. In addition, a busbar for the current input-side contacting can be dispensed with. This measure therefore facilitates a reduction of the leakage inductance in the power module 10 as well as a simplified design. As a result, the circuit-breakers 142, 144 are subjected, to a lesser extent, to a risk of blowing, which is due to high voltage peaks present at the circuit-breakers 142, 144 caused by the short switching times in combination with the leakage inductance. The functionability of the power module 10 is therefore increased.

According to example aspects of the invention, the contact elements 182 are also arranged in the same zone as the first circuit-breaker group of circuit-breakers 142, namely in the first zone 122 of the metal layer. As a result, the length of the electrical line between the circuit-breakers 142 and the contact elements 182 of the current input is minimized, which reduces the leakage inductance in the power module 10. This also yields a power module 10, in which the circuit-breakers 142, 144 are subjected, to a lesser extent, to a risk of blowing and, associated therewith, the performance is increased.

Figure 2:
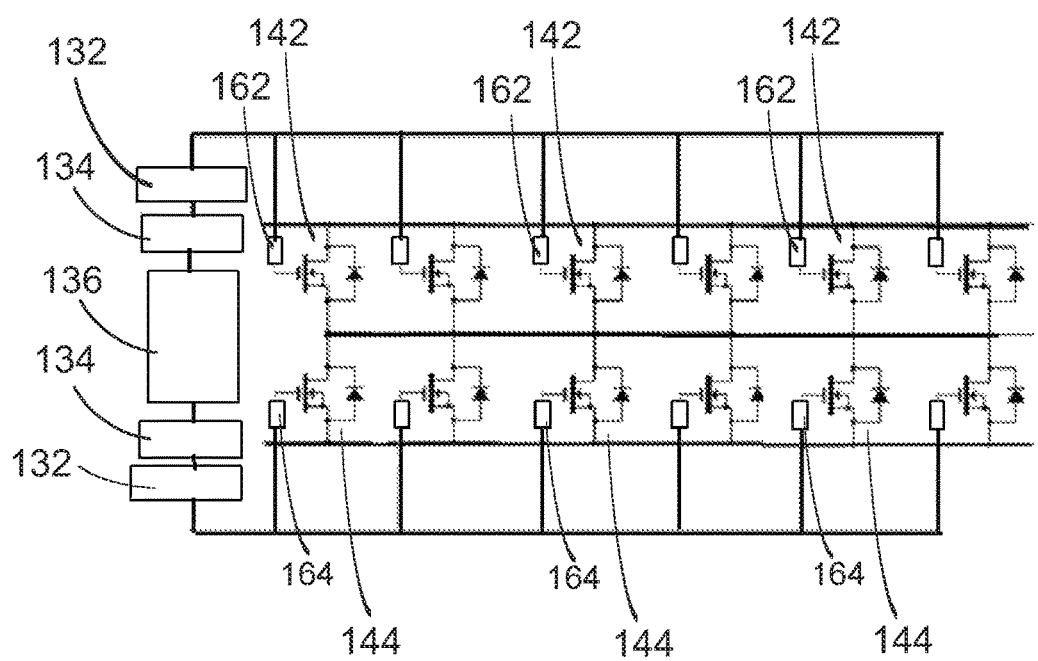
FIG. 2 shows a schematic of an electrical circuit of the example power module from FIG. 1.

FIG. 2 diagrammatically shows an electrical circuit related to a portion of the power module 1 from FIG. 1. In the electrical circuit, the circuit-breakers 142 of the first circuit-breaker group and the circuit-breakers 144 of the second circuit-breaker group are shown. The circuit-breakers 142 are connected to one another in parallel within the first circuit-breaker group. The circuit-breakers 144 are also connected to one another in parallel within the second circuit-breaker group. The first circuit-breaker group and the second circuit-breaker group are connected to one another in series.

The first impedances 162 and the second impedances 164 designed as electrical resistors, by way of example, are also shown in FIG. 2. The first impedances or electrical resistors 162 are each connected at a first end to a gate electrode of the particular circuit-breaker 142 of the first circuit-breaker group and, at a second end opposite the first end, to a gate control unit 136 via a further electrical resistor 132 and a buffer 134. The second impedances or electrical resistors 164 are each connected at a first end to a gate electrode of the particular circuit-breaker 144 of the second circuit-breaker group and, at a second end opposite the first end, to a further gate control unit 136 via an additional further electrical resistor 132 and an additional buffer 134. The gate control unit 136 is utilized for activating the gate electrodes of the individual circuit-breakers 142, 144 and can include one or multiple integrated circuit(s). The electrical or signal connection between the first electrical resistances 162 and the circuit-breakers 142 of the first zone 122 and between the second electrical resistances 164 and the circuit-breakers 144 of the second zone 124 can be implemented by wire bonding or lead frame.

Due to the utilization of the impedances or electrical resistors 162, 164, the stability of the control signals communicated between the gate electrodes of the circuit-breakers 142, 144 and the gate control unit 136 is increased. This facilitates a low-noise signal line for the gate activation and, thereby, an improved performance of the power module 10.

Modifications and variations can be made to the embodiments illustrated or described herein without departing from the scope and spirit of the invention as set forth in the appended claims. In the claims, reference characters corresponding to elements recited in the detailed description and the drawings may be recited. Such reference characters are enclosed within parentheses and are provided as an aid for reference to example embodiments described in the detailed description and the drawings. Such reference characters are provided for convenience only and have no effect on the scope of the claims. In particular, such reference characters are not intended to limit the claims to the particular example embodiments described in the detailed description and the drawings.

REFERENCE CHARACTERS 10 power module
12 substrate
121 insulating layer
122-130 metal layer
122 first zone
124 second zone
126 third zone
128 fourth zone
130 fifth zone
132 resistance
134 buffer
136 gate control unit
142, 144 circuit-breaker
162 first impedance
164 second impedance
182, 184 current input (contact element)
192 current output

The invention claimed is:

1. A power module (10) for operating an electric vehicle drive, comprising:
a current input configured for supplying an input current, the current input comprising a plurality of contact elements (182, 184) with a first subset (182) of the contact elements (182, 184);
a plurality of circuit-breakers (142, 144) configured for generating an output current based on the supplied input current, the circuit-breakers (142, 144) subdivided into a plurality of groups with a first group and a second group;
a current output (192) configured for outputting the output current at a consumer; and
a substrate (12) comprising a metal layer (122-130) and an insulating layer (121) connected to the metal layer (122-130), the metal layer (122-130) comprising a plurality of discrete zones (122-130) with a first zone and a second zone that are spaced apart from each other on the substrate (12),
wherein each of the groups of the circuit-breakers (142, 144) is associated with a respective one of the discrete zones (122-130) of the metal layer, the circuit-breakers (142, 144) of the first group (142) are arranged on the metal layer (122-130) at the first zone (122), the circuit-breakers (142, 144) of the second group (144) are arranged on the metal layer (122-130) at the second zone (124), the contact elements (182, 184) are arranged on the metal layer (122-130) such that the contact elements (182, 184) extend perpendicular to a surface of the substrate (12), and the first subset (182) of the contact elements (182, 184) is arranged in the metal layer (122-130) at the first zone (122).

2. The power module (10) of claim 1, wherein a second subset (184) of the contact elements (182, 184) is arranged in the metal layer (122-130) at the third zone (126) of the metal layer (122-130) that is spaced apart from the first and second zones (122, 124).

3. The power module (10) of claim 1, wherein the current output (192) is electrically coupled with the metal layer (122-130) at the second zone (124).

4. The power module (10) of claim 1, wherein an electrical resistor (162, 164) is connected between a gate electrode of at least one of the circuit-breakers (142, 144) and a control unit (136) for activating the gate electrode.

5. The power module (10) of claim 1, further comprising a plurality of resistors (162, 164), each of the resistors (162, 164) connected between a respective one of a plurality of gate electrodes and a control unit (136) for activating the gate electrodes, each of the gate electrodes associated with a respective one of the circuit-breakers (142, 144).

6. The power module (10) of claim 5, wherein the circuit-breakers (142, 144) are associated with a current phase.

7. The power module (10) of claim 2, wherein the current input is a direct current input, the first subset (182) of the contact elements (182, 184) are a positive pole of the direct current input, the second subset (184) of the contact elements (182, 184) are a negative pole of the direct current input, and the current output (192) is an alternating current output.

8. The power module (10) of claim 1, wherein the circuit-breakers (142, 144) of the first group (142) are high-side switches, and the circuit-breakers (142, 144) of the second group (144) are low-side switches.

9. The power module (10) of claim 8, the first group (142) comprises six circuit-breakers, and the second group (144) comprises six circuit-breakers.

* * * * *